(12) United States Patent
Sinha et al.

(10) Patent No.: US 12,218,079 B2
(45) Date of Patent: Feb. 4, 2025

(54) SEMICONDUCTOR DEVICES WITH REINFORCED SUBSTRATES

(71) Applicant: Micron Technology, Inc., Boise, ID (US)

(72) Inventors: Koustav Sinha, Boise, ID (US); Shams U. Arifeen, Boise, ID (US); Christopher Glancey, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 18/151,029

(22) Filed: Jan. 6, 2023

(65) Prior Publication Data
US 2023/0154868 A1 May 18, 2023

Related U.S. Application Data

(62) Division of application No. 17/013,321, filed on Sep. 4, 2020, now Pat. No. 11,552,029.

(51) Int. Cl.
*H01L 23/00* (2006.01)
*H01L 21/48* (2006.01)
*H01L 23/16* (2006.01)
*H01L 23/31* (2006.01)
*H01L 23/498* (2006.01)

(52) U.S. Cl.
CPC ........ *H01L 23/562* (2013.01); *H01L 21/4853* (2013.01); *H01L 23/16* (2013.01); *H01L 23/3128* (2013.01); *H01L 23/49816* (2013.01)

(58) Field of Classification Search
CPC .... H01L 23/562; H01L 21/4853; H01L 23/16
See application file for complete search history.

(56) References Cited

U.S. PATENT DOCUMENTS

| 9,324,626 | B2 | 4/2016 | Shen et al. |
| 9,899,305 | B1 | 2/2018 | Yeh et al. |
| 11,322,457 | B2 | 5/2022 | Raorane et al. |
| 2013/0200528 | A1 | 8/2013 | Lin et al. |

(Continued)

FOREIGN PATENT DOCUMENTS

| TW | 21839931 A | 11/2018 |
| TW | 202011551 A | 3/2020 |
| TW | 202032679 A | 9/2020 |

OTHER PUBLICATIONS

Office Action and Search Report mailed Apr. 27, 2022 for Taiwanese Patent Application No. 110132797, 15 pages (with translation).

(Continued)

*Primary Examiner* — Thao P Le
(74) *Attorney, Agent, or Firm* — Perkins Coie LLP

(57) ABSTRACT

Semiconductor devices having reinforcement structures configured to mitigate thermomechanical stresses, and associated systems and methods, are disclosed herein. In one embodiment, a semiconductor package includes a semiconductor die and a substrate coupled to the semiconductor die. The substrate can include a base structure and a reinforcement structure at least partially within a die shadow region of the substrate. The reinforcement structure can be at least partially surrounded by the base structure. The reinforcement structure has a higher stiffness than the base structure.

20 Claims, 8 Drawing Sheets

(56) References Cited

U.S. PATENT DOCUMENTS

| | | |
|---|---|---|
| 2015/0380343 A1 | 12/2015 | Koontz et al. |
| 2016/0181218 A1 | 6/2016 | Karhade et al. |
| 2019/0051615 A1 | 2/2019 | Nair et al. |
| 2019/0341271 A1 | 11/2019 | Karhade et al. |
| 2020/0083179 A1 | 3/2020 | Lee et al. |
| 2020/0105544 A1 | 4/2020 | Tsai et al. |
| 2020/0135631 A1 | 4/2020 | Seo et al. |
| 2021/0005532 A1 | 1/2021 | Kwon et al. |
| 2021/0098421 A1* | 4/2021 | Wu .................. H01L 23/49811 |
| 2021/0118790 A1 | 4/2021 | Choi |
| 2021/0118812 A1 | 4/2021 | Liu et al. |
| 2021/0183817 A1 | 6/2021 | Lee et al. |
| 2021/0287999 A1 | 9/2021 | Min et al. |
| 2021/0375785 A1* | 12/2021 | Wu ................... H01L 21/4857 |
| 2022/0077076 A1 | 3/2022 | Sinha et al. |
| 2024/0063165 A1* | 2/2024 | Nallavelli ............ H01L 25/0652 |
| 2024/0063203 A1* | 2/2024 | Marin .................... H01L 25/18 |
| 2024/0071883 A1* | 2/2024 | Marin .................... H01L 23/15 |
| 2024/0079303 A1* | 3/2024 | Lin ..................... H01L 23/5384 |
| 2024/0087971 A1* | 3/2024 | Marin ................. H01L 23/5381 |
| 2024/0112981 A1* | 4/2024 | Kim .................... H01L 23/3677 |
| 2024/0120283 A1* | 4/2024 | Fay ........................ H01L 24/25 |

OTHER PUBLICATIONS

Office Action mailed Sep. 14, 2022 for Taiwanese Patent Application No. 110132797, 6 pages (with translation).

\* cited by examiner

SEMICONDUCTOR DEVICES WITH REINFORCED SUBSTRATES

CROSS-REFERENCE TO RELATED APPLICATION(S)

This application is a divisional of U.S. patent application Ser. No. 17/013,321, filed Sep. 4, 2020, which is incorporated herein by reference in its entirety.

TECHNICAL FIELD

The present technology generally relates to semiconductor devices, and more particularly relates to semiconductor devices having substrates with reinforcement structures configured to mitigate thermomechanical stresses.

BACKGROUND

Packaged semiconductor dies, including memory chips, microprocessor chips, and imager chips, typically include a semiconductor die mounted on a substrate and encased in a protective covering. The semiconductor die can include functional features, such as memory cells, processor circuits, and imager devices, as well as bond pads electrically connected to the functional features. The bond pads can be electrically connected to terminals outside the protective covering to allow the semiconductor die to be connected to higher level circuitry.

In some semiconductor assemblies, a packaged semiconductor die can be electrically coupled to a printed circuit board (PCB) via solder bumps arranged in a ball grid array (BGA). However, cyclic heating and/or cooling of the semiconductor package can induce significant thermomechanical stress between the semiconductor package and the PCB due to a mismatch in the coefficients of thermal expansion (CTE) of these components. Often, the stress can induce cracking of the semiconductor package at or near the solder joints, which can render the semiconductor package inoperable.

BRIEF DESCRIPTION OF THE DRAWINGS

Many aspects of the present technology can be better understood with reference to the following drawings. The components in the drawings are not necessarily to scale. Instead, emphasis is placed on illustrating clearly the principles of the present technology.

DETAILED DESCRIPTION

Figure 1A:
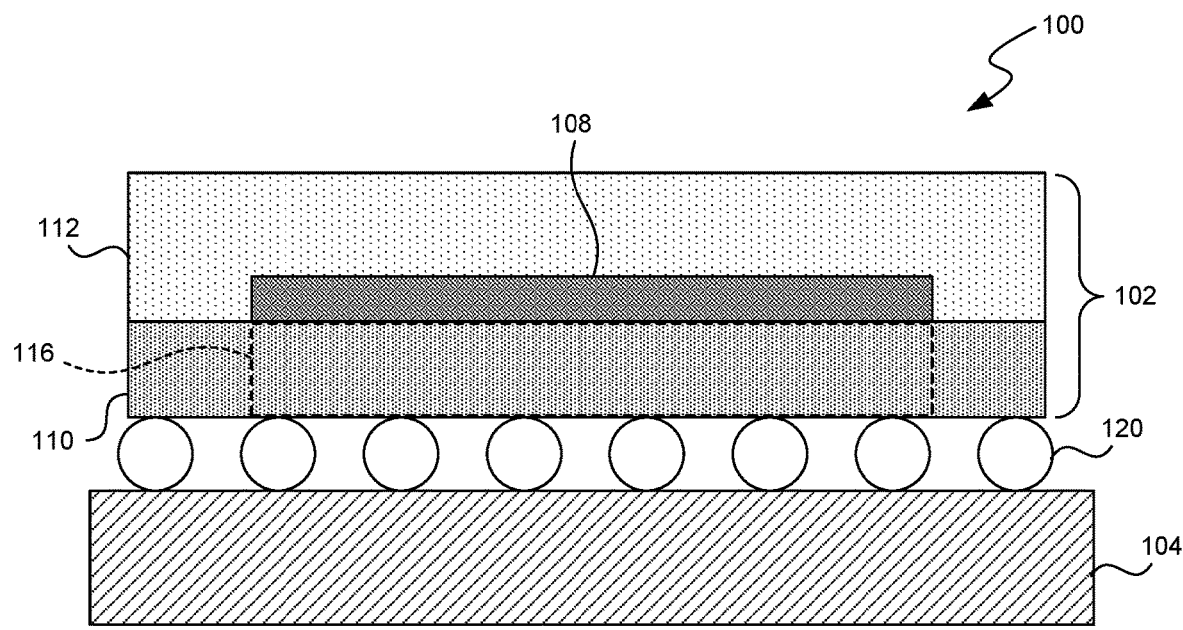
FIG. 1A is a side cross-sectional view of a semiconductor assembly.

Specific details of several embodiments of semiconductor devices, and associated systems and methods, are described below. In some embodiments, for example, a semiconductor device configured in accordance with the present technology includes a substrate coupled to a semiconductor die. The substrate can include a base structure and a reinforcement structure (e.g., a structure formed from a strengthening or stiffening material, such as a metallic material) at least partially embedded in the base structure (e.g., at least partially surrounded by the base structure). The reinforcement structure can be located at least partially within a region associated with the periphery of the semiconductor die referred to herein as "a die shadow region" of the substrate, and it can have a higher stiffness than the base structure. In some embodiments, the geometry, properties, and arrangement of the reinforcement structure reduces or prevents deformation of the substrate at or near the die shadow region, such as warping or bending due to CTE mismatch during cyclic heating and cooling. The reinforcement structures described herein can reduce the amount of thermomechanical stress on the semiconductor device during operation (e.g., on the solder connectors coupling the substrate to a PCB), thus reducing the likelihood of cracking, fatigue, or other mechanical and/or electrical failures. The present technology can improve the reliability and robustness of semiconductor devices, particularly in applications involving temperature and/or power cycling or other harsh field usage conditions such as automotive applications.

A person skilled in the relevant art will recognize that suitable stages of the methods described herein can be performed at the wafer level or at the die level. Therefore, depending upon the context in which it is used, the term "substrate" can refer to a wafer-level substrate or to a singulated, die-level substrate. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, plating, electroless plating, spin coating, and/or other suitable techniques. Similarly, materials can be removed, for example, using plasma etching, wet etching, chemical-mechanical planarization, or other suitable techniques.

Numerous specific details are disclosed herein to provide a thorough and enabling description of embodiments of the present technology. A person skilled in the art, however, will understand that the technology may have additional embodiments and that the technology may be practiced without several of the details of the embodiments described below with reference to FIGS. 2A-5. For example, some details of semiconductor devices and/or packages well known in the art have been omitted so as not to obscure the present technology. In general, it should be understood that various other devices and systems in addition to those specific embodiments disclosed herein may be within the scope of the present technology.

As used herein, the terms "vertical," "lateral," "upper," "lower," "above," and "below" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

FIG. 1A is a side cross-sectional view of a semiconductor assembly 100 ("assembly 100") including a semiconductor package 102 coupled to a PCB 104 via an array of connectors 120 (e.g., a solder BGA). The semiconductor package 102 includes a semiconductor die 108 mounted on a package substrate 110 and encapsulated by a mold material 112. As can be seen in FIG. 1A, the package substrate 110 includes a die shadow region 116 vertically underneath the semiconductor die 108 and at least generally aligned with the peripheral edges of the semiconductor die 108 (e.g., the region of the substrate 110 within the footprint defined by the perimeter of the semiconductor die 108).

Figure 1B:
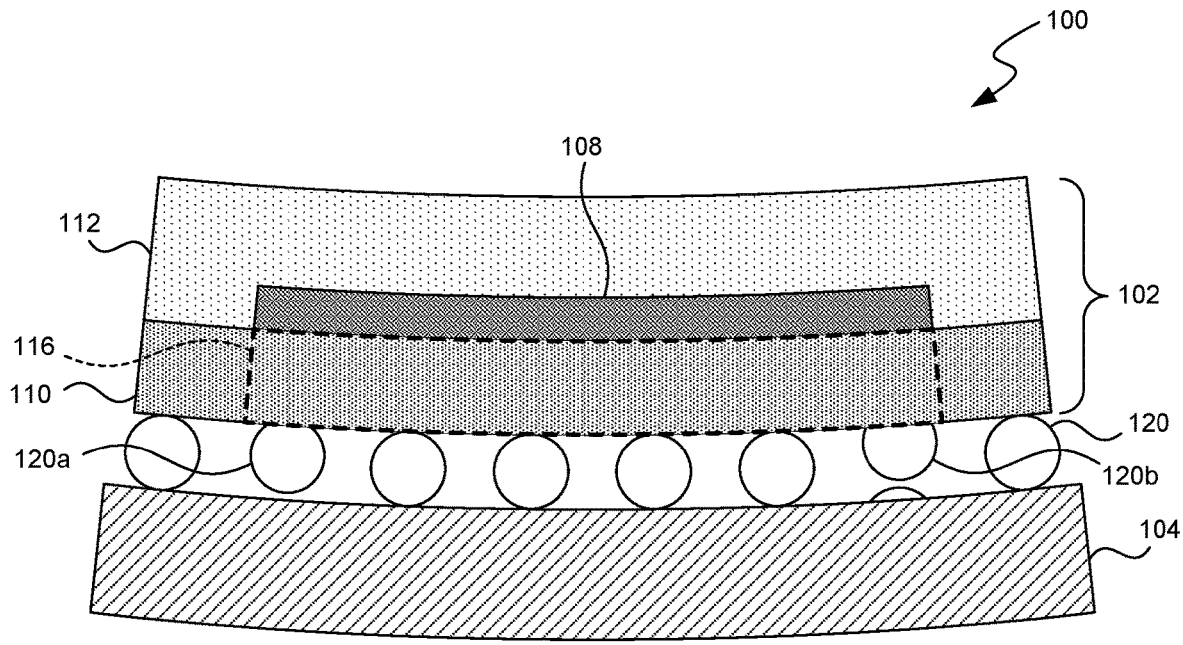
FIG. 1B is a side cross-sectional view of the semiconductor assembly of FIG. 1A when subjected to thermomechanical stress.

FIG. 1B is a side cross-sectional view of the assembly 100 when subjected to thermomechanical stress, e.g., during manufacturing and/or usage. Thermomechanical stresses may be induced, for example, by the assembly process, by thermal cycling and/or thermal shock during component/board level reliability testing, and/or by temperature and/or power cycling during end-customer usage. In some embodiments, the semiconductor package 102 or a component thereof (e.g., the package substrate 110) has a CTE that is different than the CTE of the PCB 104, and the CTE mismatch between these components causes them to deform (e.g., warp, bend) relative to one another during cooling and/or heating of the assembly 100. For example, as shown in FIG. 1B, the semiconductor package 102 and PCB 104 has a warped, non-planar shape after heating and/or cooling. The relative deformation of the semiconductor package 102 and the PCB 104 results in thermomechanical loading of the connectors 120 that leads to fatigue and/or creep failures. For example, as shown in FIG. 1B, cracks can form and propagate within the connectors 120 located near or within the die shadow region 116, particularly connectors 120a-b at or near the edges of the die shadow region 116. Cracks can also form and propagate at the interface between the connectors 120 and the semiconductor package 102 or the PCB 104, such as in the material of the package substrate 110 and/or the PCB 104. Once the crack length reaches a critical value, the electrical coupling between the package 102 and the PCB 104 is disrupted, rendering the assembly 100 fully or partially inoperable. This process is accelerated under conditions where the assembly 100 is subject to cyclic loading and/or extreme temperature fluctuations (e.g., in automotive applications).

Figure 2A:
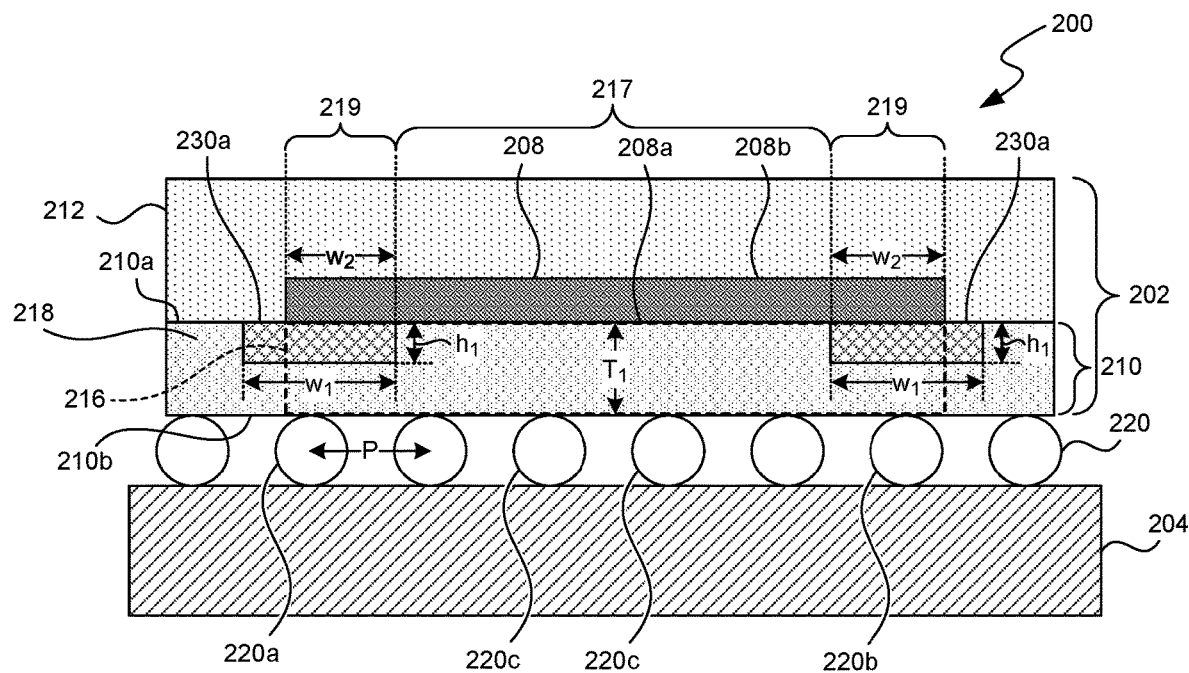
FIG. 2A is a side-cross sectional view of a semiconductor assembly including a package substrate with reinforcement structures configured in accordance with embodiments of the present technology.

FIG. 2A is a side-cross sectional view of a semiconductor assembly 200 having a package substrate with reinforcement structures configured in accordance with embodiments of the present technology. The assembly 200 includes a semiconductor package 202 coupled to a PCB 204 via an array of connectors 220. The semiconductor package 202 includes a semiconductor die 208, which can include a semiconductor substrate (e.g., a silicon substrate, a gallium arsenide substrate, an organic laminate substrate, etc.) and various types of semiconductor components and/or functional features, such as memory circuits (e.g., dynamic random-access memory (DRAM), static random-access memory (SRAM), flash memory, or other type of memory circuits), controller circuits (e.g., DRAM controller circuits), logic circuits, processing circuits, circuit elements (e.g., wires, traces, interconnects, transistors, etc.), imaging components, and/or other semiconductor features. Although the illustrated embodiment shows a single semiconductor die 208, in other embodiments the semiconductor package 202 can include multiple semiconductor dies (e.g., two, four, five, six, seven, eight nine, ten, or more dies) arranged in one or more die stacks.

The semiconductor package 202 can also include a package substrate 210 carrying the semiconductor die 208. The package substrate 210 can include a redistribution structure, an interposer, a printed circuit board, a dielectric spacer, another semiconductor die (e.g., a logic die), or another suitable substrate. In some embodiments, the package substrate 210 includes semiconductor components (e.g., doped silicon wafers or gallium arsenide wafers), nonconductive components (e.g., various ceramic substrates, such as aluminum oxide ($Al_2O_3$), etc.), aluminum nitride, and/or conductive portions (e.g., interconnecting circuitry, through-silicon vias (TSVs), etc.). The package substrate 210 can be electrically coupled to the semiconductor die 208 via a plurality of interconnectors (e.g., bumps, micro-bumps, pillars, columns, studs, etc.—not shown).

The semiconductor package 202 can further include a mold material 212 formed over the package substrate 210 and/or at least partially around the semiconductor die 208.

The mold material 212 can be a resin, epoxy resin, silicone-based material, polyimide, or any other material suitable for encapsulating the semiconductor die 208 and/or at least a portion of the package substrate 210 to protect these components from contaminants and/or physical damage. In some embodiments, the semiconductor package 202 includes other components such as external heatsinks, a casing (e.g., thermally conductive casing), electromagnetic interference (EMI) shielding components, etc.

The semiconductor package 202 can be electrically coupled to the PCB 204 via the array of connectors 220 (e.g., solder balls, conductive bumps, conductive pillars, conductive epoxies, and/or other suitable electrically conductive elements). Each connector 220 can electrically couple the package substrate 210 to the PCB 204, e.g., via respective bond pads on the surfaces of these components (not shown). As a result, the semiconductor die 208 can be electrically coupled to the PCB 204 via the package substrate 210 and connectors 220. Optionally, the connectors 220 can be surrounded by an underfill material (not shown).

The package substrate 210 includes one or more reinforcement structures 230a configured with respect to the semiconductor die 208 to reduce or mitigate thermomechanical stresses on the connectors 220. As discussed above, the connectors 220 located near or underneath a die shadow region 216 may be particularly susceptible to failure due to thermomechanical stress. Accordingly, the reinforcement structures 230a can increase the stiffness of the package substrate 210 at or near at least portions of the die shadow region 216 to reduce or prevent bending or other deformation of the package substrate 210, e.g., during temperature cycling. In the illustrated embodiment, for example, the package substrate 210 includes a base structure 218, and the reinforcement structures 230a are at least partially embedded in and/or at least partially surrounded by the base structure 218. Each reinforcement structure 230a can be located partially or entirely within the die shadow region 216. For example, the embodiment of FIG. 2A includes two reinforcement structures 230a located partially underneath the edges of the semiconductor die 208 and overlapping peripheral edges or boundaries of the die shadow region 216. In other embodiments, the package substrate 210 can include fewer or more reinforcement structures 230a (e.g., one, three, four, five, six, seven, eight, nine, ten, or more), and/or the reinforcement structures 230a can be at different locations, as described further below.

The reinforcement structures 230a can each comprise a material having a high Young's modulus and/or high CTE, including, but not limited to copper, aluminum, silicon, or other suitable metals or strengthening or stiffening materials. The material of the reinforcement structures 230a can have a higher Young's modulus and/or CTE than the material of base structure 218 of the package substrate 210. For example, the base structure 218 can be made of any material typically used for semiconductor package substrates, such as a laminate (e.g., epoxy-based laminates, resin-based laminates), polymer (e.g., polyimide), fiber-reinforced material, or combinations thereof. As a result, the reinforcement structures 230a can have a greater stiffness than the base structure 218. For example, the reinforcement structures 230a can be at least 2 times, 3 times, 4 times, 5 times, 10 times or 20 times stiffer than the base structure 218. Stiffer reinforcement structures 230a may reduce or inhibit bending or warping of the package substrate 210 during cyclic heating and/or cooling of the semiconductor package 202, thus reducing thermomechanical loads on the package substrate 210 and/or connectors 220 that may lead to creep, cracking, and/or other mechanical and/or electrical failures.

The reinforcement structures 230a can have any suitable dimension (e.g., cross-sectional area, width, height, etc.). For example, the reinforcement structures 230a can include a height $h_1$ that is less than the total thickness $T_1$ of the package substrate 210. In some embodiments, the height $h_1$ can be no more than 5%, 10%, 20%, 30%, 40%, or 50% of the thickness $T_1$. Optionally, the height $h_1$ can be within a range from 20% to 30% of the thickness $T_1$. The thickness $T_1$ of the package substrate 210 can be within a range from 100 to 300 microns. In such embodiments, the height $h_1$ can be no more than 5, 25, 50, 75, 100, 125, or 150 microns.

The reinforcement structures 230a can be positioned over and/or aligned with one or more connectors 220. The reinforcement structures 230a can have a width $w_1$ that partially or completely spans one or more connectors 220 (e.g., connectors located adjacent or near the die shadow region 216, or that are otherwise vulnerable to failure). For example, in the illustrated embodiment, the reinforcement structures 230a are positioned over connectors 220a-b near a peripheral portion 219 of the die shadow region 216. In other embodiments, however, some or all of the reinforcement structures 230a can be positioned over other connectors 220, such as one or more connectors 220c near a central or interior portion 217 of the die shadow region 216.

In some embodiments, the connectors 220 are arranged in an array having a pitch p, and the width $w_1$ is within a range from 25% to 200% of the pitch p. For example, the width $w_1$ can be at least 5%, 10%, 15%, 20%, 25%, 30%, 40%, 50%, 60%, 70%, 80%, 90%, 100%, 110%, 120%, 130%, 140%, 150%, 160%, 170%, 180%, 190%, or 200% of the pitch p. As another example, the width $w_1$ can be no more than 5%, 10%, 15%, 20%, 25%, 30%, 40%, 50%, 60%, 70%, 80%, 90%, 100%, 110%, 120%, 130%, 140%, 150%, 160%, 170%, 180%, 190%, or 200% of the pitch p. In some embodiments, the width $w_1$ can be at least 50, 100, 150, 200, 250, 300, 350, 400, 450 or 500 microns. Alternatively or in combination, the width $w_1$ can be no more than 50, 100, 150, 200, 250, 300, 350, 400, 450 or 500 microns.

As discussed above, the reinforcement structures 230a can be at least partially or entirely within the die shadow region 216 of the substrate 210. The die shadow region 216 can include a central portion 217 and a peripheral portion 219 which surrounds the central portion 217. The peripheral portion 219 can be located near the edges of the die shadow region 216 and have an outer boundary defined by the perimeter of the semiconductor die 208, while the central portion 217 can be spaced inwardly from the peripheral portion 219. In some embodiments, the peripheral portion 219 exhibits more strain under thermomechanical loading than the central portion 217. Accordingly, the reinforcement structures 230a can be localized to the peripheral portion 219 of the die shadow region 216, such that the central portion 217 only includes the base structure 218 without any reinforcement structures 230a. In other embodiments, however, the reinforcement structures 230a can extend into the central portion 217 or can be located entirely within the central portion 217, such the central portion includes both the base structure 218 and the reinforcement structures 230a.

In the illustrated embodiment, the reinforcement structures 230a extend laterally outward from the outer boundary of the die shadow region 216 such that the peripheral portion 219 includes only a portion of the reinforcement structures 230a. In other embodiments, however, the reinforcement structures 230a can be entirely within the die shadow region 216 such that the peripheral portion 219 includes the entirety of the reinforcement structure 230a. In the illustrated embodiment, the peripheral portion 219 also includes a portion of the base structure 218 under the reinforcement structures 230a. In other embodiments, the peripheral portion 219 can include only the reinforcement structure 230a without the base structure 218.

In some embodiments, the peripheral portion 219 has a width $w_2$. The width $w_2$ can be approximately equal to, less than, or greater than the pitch p of the connectors 220. For example, the width $w_2$ of the peripheral portion 219 can be approximately 5%, 10%, 15%, 20%, 25%, 30%, 40%, 50%, 60%, 70%, 80%, 90%, 100%, 110%, 120%, 130%, 140%, 150%, 160%, 170%, 180%, 190%, or 200% of the pitch p. In a further example, the width $w_2$ of the peripheral portion 219 can be approximately 50, 100, 150, 200, 250, 300, 350, 400, 450, or 500 microns.

The reinforcement structures 230a can have any suitable cross-sectional shape. In the illustrated embodiment, for example, the reinforcement structures 230a each have a rectangular shape. In other embodiments, some or all of the reinforcement structures 230a can have a different cross-sectional shape, such as a circular, square, oblong, oval, rectilinear, elliptical, polygonal, or curvilinear cross-sectional shape, or a combination thereof. Optionally, some or all of the corners of the reinforcement structures 230a can be rounded, e.g., to reduce stress concentration.

The reinforcement structures 230a can be positioned at any suitable vertical location within the package substrate 210. For example, the package substrate 210 includes an upper surface 210a near the semiconductor die 208, and a lower surface 210b opposite the upper surface 210a spaced apart from the semiconductor die 208 and near the connectors 220. In the illustrated embodiment, the reinforcement structures 230a are positioned near or at the upper surface 210a of the package substrate 210, and extend partially through the thickness $T_1$ of the package substrate 210 toward the lower surface 210b of the package substrate 210. In other embodiments, some or all of the reinforcement structures 230a can be at a different vertical location within the package substrate 210, as discussed in greater detail below. In some embodiments, the reinforcement structures 230a contact the semiconductor die 208. In other embodiments, the reinforcement structures 230a do not contact the semiconductor die 208 but instead are spaced apart from the semiconductor die 208 (e.g., by a die attach film, interconnectors such as microbumps, underfill material, etc.).

The semiconductor assembly 200 can be manufactured in a variety of different ways. For example, the package substrate 210 can be manufactured by forming one or more recesses in the base structure 218. In some embodiments, each recess is formed by removing a portion of the base structure 218 (e.g., by cutting, drilling, etc.). Alternatively, the base structure 218 can be pre-formed with the recesses. Subsequently, each reinforcement structure 230a can be positioned at least partially or entirely in a corresponding recess and secured to the base structure 218 in order to form the package substrate 210 (e.g., by deposition, bonding, laminating, etc.). In some embodiments, each reinforcement structure 230a is a pre-formed solid component that is inserted into the recess. In other embodiments, each reinforcement structure 230a can be formed in situ within the recess (e.g., by deposition or other processes known to those of skill in the art). The semiconductor die 208 can then be mounted onto the package substrate 210 such that the semiconductor die 208 is positioned at least partially over the reinforcement structures 230a. The semiconductor die 208 can include an active or front side 208a facing toward the package substrate 210 and a back side 208b facing away from the package substrate 210. In other embodiments, however, the semiconductor die 208 can be mounted with the front side 208a facing up and away from the package substrate 210 and the back side 208b facing down toward the package substrate 210.

FIGS. 2B-2F illustrate semiconductor assemblies with various examples of reinforcement structures configured in accordance with embodiments of the present technology. The assemblies shown in FIGS. 2B-2F can be generally similar to the assembly 200 described with respect to FIG. 2A. Accordingly, like numbers are used to identify similar or identical components, and discussion of the assemblies shown in FIGS. 2B-2F will be limited to those features that differ from the assembly 200 of FIG. 2A.

Figure 2B:
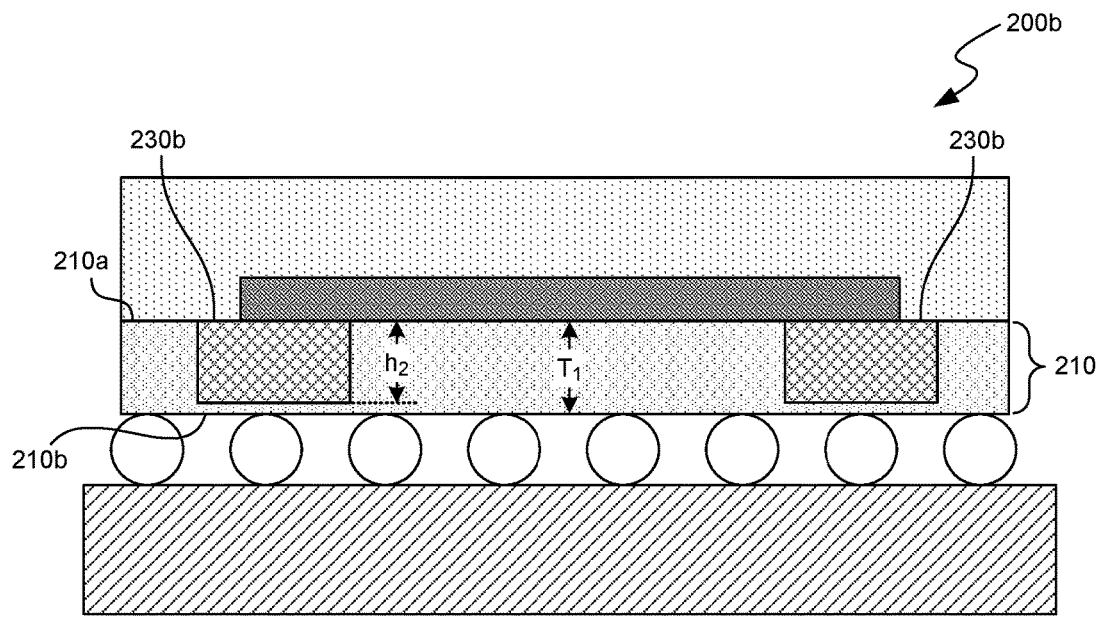
FIG. 2B is a side-cross sectional view of another example of a semiconductor assembly including a package substrate with reinforcement structures configured in accordance with embodiments of the present technology.

FIG. 2B is a side cross-sectional view of a semiconductor assembly 200b including a package substrate 210 with reinforcement structures 230b configured in accordance with embodiments of the present technology. The reinforcement structures 230b are generally similar to the reinforcement structures 230a of FIG. 2A, except that a height $h_2$ of the reinforcement structures 230b is greater than or equal to 50% of the thickness $T_1$, and less than 100% of the thickness $T_1$. In some embodiments, the height $h_2$ is at least 50%, 60%, 70%, 80%, 90%, or 95% of the thickness $T_1$. For example, the thickness $T_1$ of the package substrate 210 can be within a range from 100 to 300 microns, and the height $h_2$ can be at least 50 microns and less than 300 microns (e.g., greater than or equal to 60, 70, 80, 90 100, 125, 150, 175, 200, 225, 250, or 275 microns).

Figure 2C:
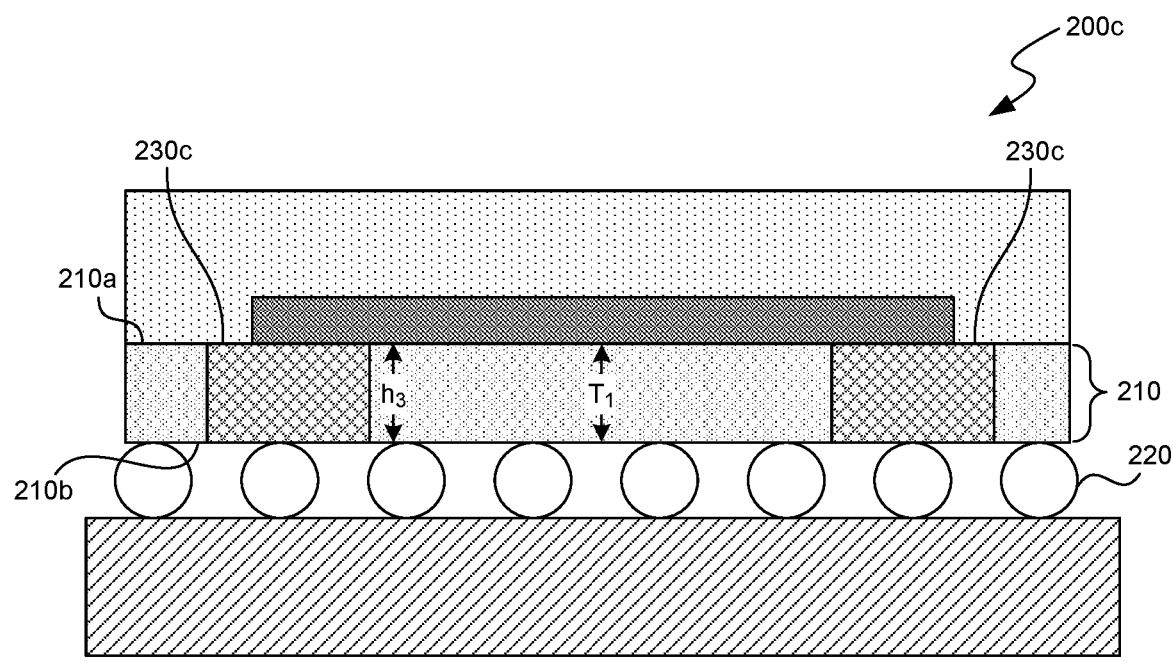
FIG. 2C is a side-cross sectional view of another example of a semiconductor assembly including a package substrate with reinforcement structures configured in accordance with embodiments of the present technology.

FIG. 2C is a side cross-sectional view of a semiconductor assembly 200c including a package substrate 210 with reinforcement structures 230c configured in accordance with embodiments of the present technology. The reinforcement structures 230c are generally similar to the reinforcement structures 230a of FIG. 2A, except that the reinforcement structures 230c extend through the entire thickness $T_1$ of the package substrate 210 such that a height $h_3$ of the reinforcement structures 230c is equal to or approximately equal to the thickness $T_1$. For example, the thickness $T_1$ of the package substrate 210 can be within a range from 100 to 300 microns, and the height $h_3$ can be 100, 125, 150, 175, 200, 225, 250, 275 or 300 microns. Further, because the reinforcement structures 230c extend through the entire thickness $T_1$ of the package substrate 210, the reinforcement structures 230c are at or near both the upper surface 210a and the lower surface 210b of the package substrate 210.

Figure 2D:
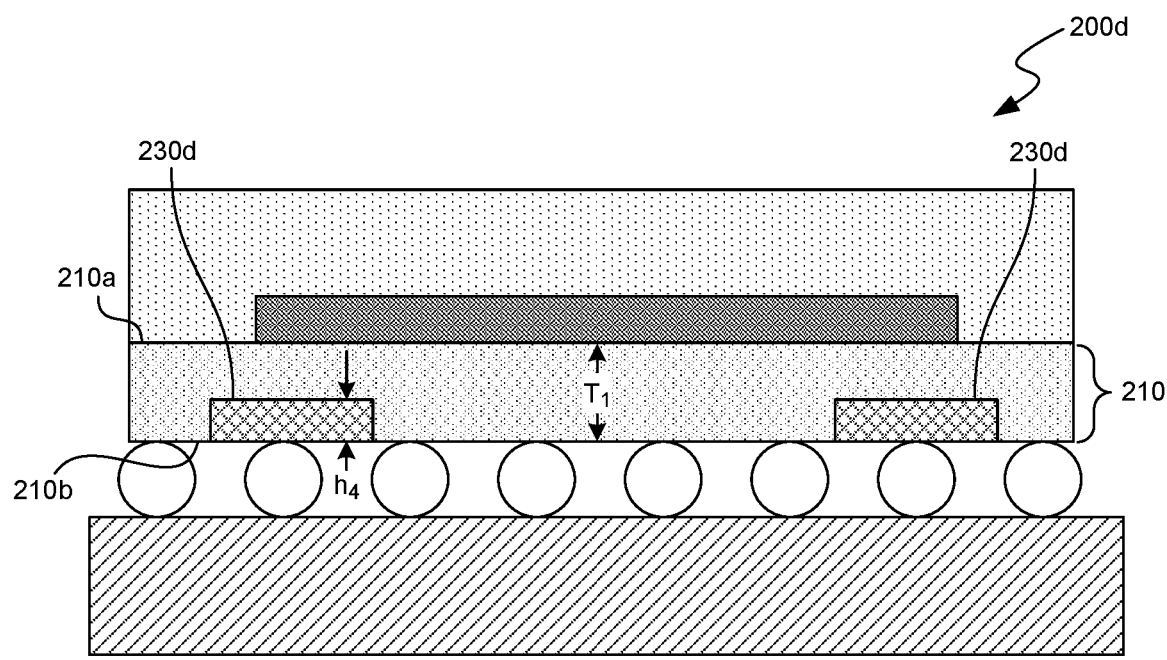
FIG. 2D is a side-cross sectional view of another example of a semiconductor assembly including a package substrate with reinforcement structures configured in accordance with embodiments of the present technology.

FIG. 2D is a side cross-sectional view of a semiconductor assembly 200d including a package substrate 210 with reinforcement structures 230d configured in accordance with embodiments of the present technology. The reinforcement structures 230d are generally similar to the reinforcement structures 230a of FIG. 2A, except that reinforcement structures 230d are located at or near the lower surface 210b of the package substrate 210, rather than the upper surface 210a. As previously described with respect to FIGS. 2A-2C, the height $h_4$ of the reinforcement structures 230d can be less than or equal to 10%, 20%, 30%, 40%, 50%, 60%, 70%, 80%, 90%, or 95% of the thickness $T_1$ of the package substrate 210.

Figure 2E:
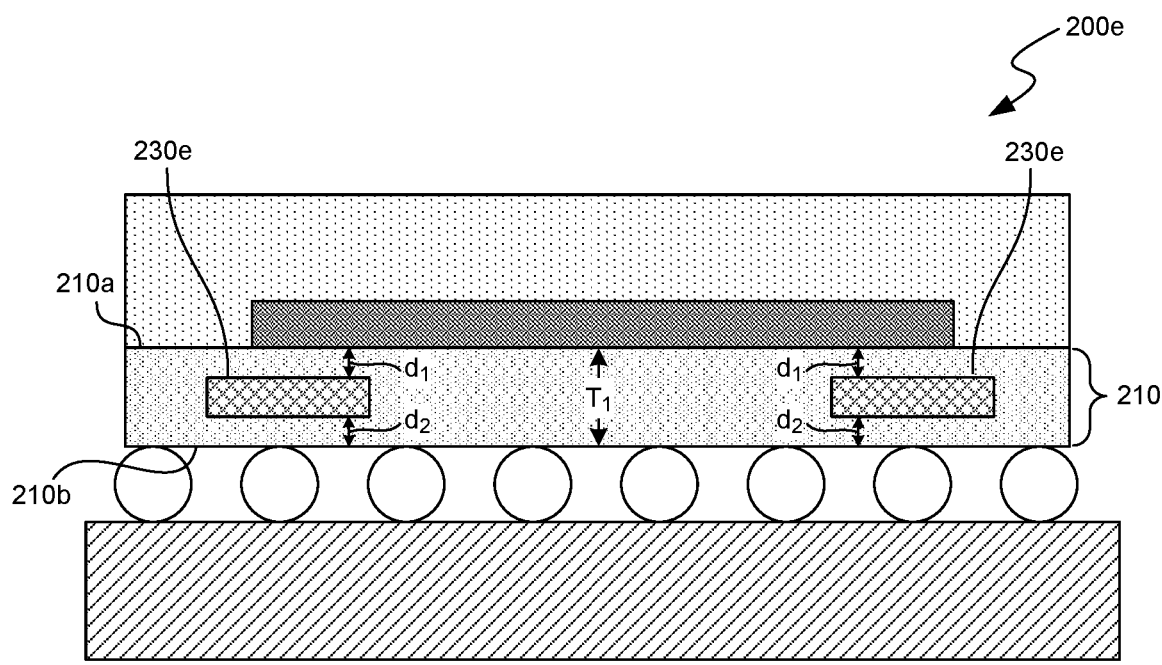
FIG. 2E is a side-cross sectional view of another example of a semiconductor assembly including a package substrate with reinforcement structures configured in accordance with embodiments of the present technology.

FIG. 2E is a side cross-sectional view of a semiconductor assembly 200e including a package substrate 210 with reinforcement structures 230e configured in accordance with embodiments of the present technology. The reinforcement structures 230e are generally similar to the reinforcement structures 230a of FIG. 2A, except that the reinforcement structures 230e are located between the upper surface 210a and lower surface 210b of the package substrate 210, without contacting the upper surface 210a and lower surface 210b. The reinforcement structures 230e are accordingly embedded completely within the package support substrate 210 (i.e., surrounded completely by the material of the package substrate 210). The reinforcement structures 230e can be spaced apart from the upper surface 210a by a first distance $d_1$, and can be spaced apart from the lower surface 210b by a second distance $d_2$. For example, the first distance $d_1$ and second distance $d_2$ can each independently be 5, 25, 50, or 100 microns, or any other suitable distance. In some embodiments, the first distance $d_1$ and second distance $d_2$ can each independently be no more than 50%, 40%, 30%, 20%, or 10% of the total thickness $T_1$ of the package substrate 210. In some embodiments, the first distance $d_1$ and second distance $d_2$ are equal or approximately equal. In other embodiments, the first distance $d_1$ can be greater than the second distance $d_2$, or vice-versa.

The semiconductor assembly 200e can be manufactured in many different ways. In some embodiments, for example, the semiconductor assembly 200e is manufactured by forming recesses in a first substrate section (e.g., corresponding to the lower portion of the base structure 218) and positioning the reinforcement structures 230e into the recesses, e.g., as discussed with above respect to FIG. 2A. Subsequently, the package substrate 210 is assembled by coupling a second substrate section (e.g., corresponding to the upper portion of the base structure 218) to the first substrate section (e.g., by laminating, bonding), such that the reinforcement structures 230e are disposed between the first and second substrate sections. As another example, the package substrate 210 can be assembled from three different substrate sections: a lower substrate section (e.g., corresponding to the lower portion of the base structure 218), a middle substrate section (e.g., including the reinforcement structures 230e and corresponding to the portion of the base structure 218 adjacent to the reinforcement structures 230e), and an upper substrate section (e.g., corresponding to the upper portion of the base structure 218). The three substrate sections can be formed separately, then subsequently coupled to each other by laminating, bonding, etc. to form the package substrate 210.

Figure 2F:
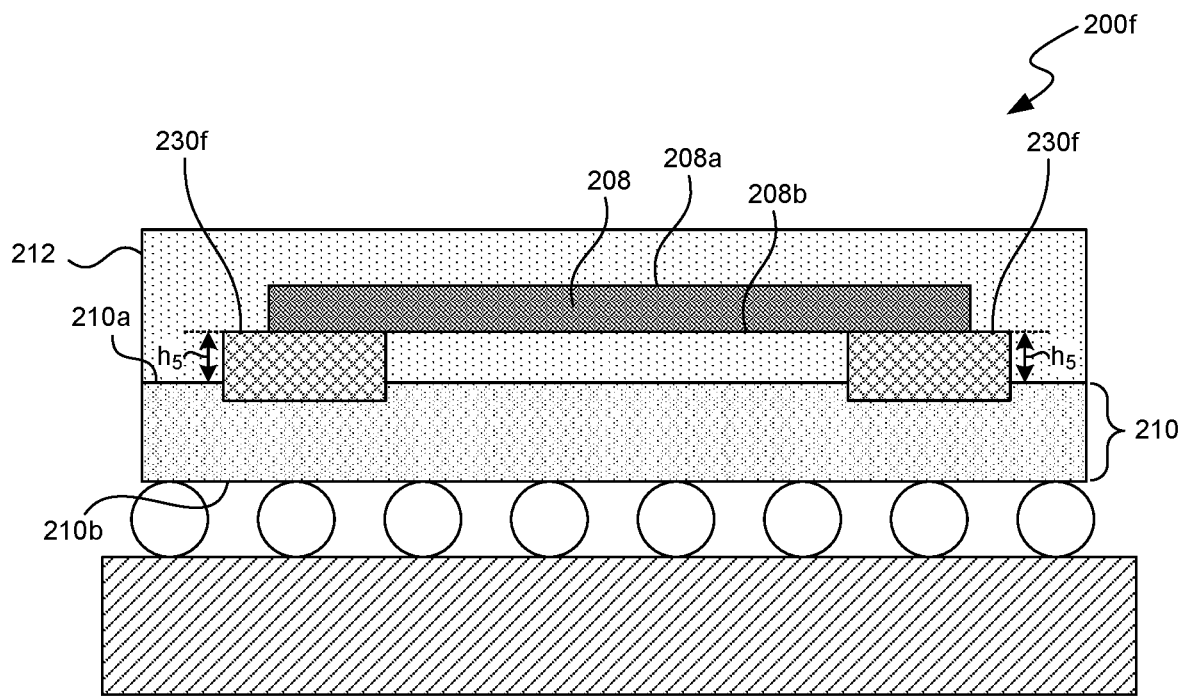
FIG. 2F is a side-cross sectional view of another example of a semiconductor assembly including a package substrate with reinforcement structures configured in accordance with embodiments of the present technology.

FIG. 2F is a side cross-sectional view of a semiconductor assembly 200f including a package substrate 210 with reinforcement structures 230f configured in accordance with embodiments of the present technology. The reinforcement structures 230f are generally similar to the reinforcement structures 230a of FIG. 2A, except that the reinforcement structures 230f protrude above the upper surface 210a of the package substrate 210 and separate the semiconductor die 208 from the upper surface 210a. The portion of the reinforcement structures 230f protruding above the upper surface 210a can have a height $h_5$ of 5, 10, 25, 50, 75, 100, 125, 150, 175, or 200 microns. In some embodiments, the configuration shown in FIG. 2F further reduces deformation of the package substrate 210 due to CTE mismatch by separating the semiconductor die 208 from the package substrate 210.

In the illustrated embodiment, the semiconductor die 208 is oriented with the active side 208a facing away from the package substrate 210 and the back side 208b facing toward the package substrate 210. The active side 208a of the semiconductor die 208 can be electrically coupled to the package substrate 210 via wire bonds (not shown). In other embodiments, the semiconductor die 208 can be oriented with the active side 208a facing toward the package substrate 210 and the back side 208b facing away from the package substrate 210. In such embodiments, the height $h_5$ can be sufficiently small so that the active side 208a can be electrically coupled to the package substrate 210 via interconnectors such as microbumps, pillars, etc. For example, the height $h_5$ can be less than or equal to 150, 125, 100, 75, 50, 25, 10, or 5 microns.

Figure 3A:
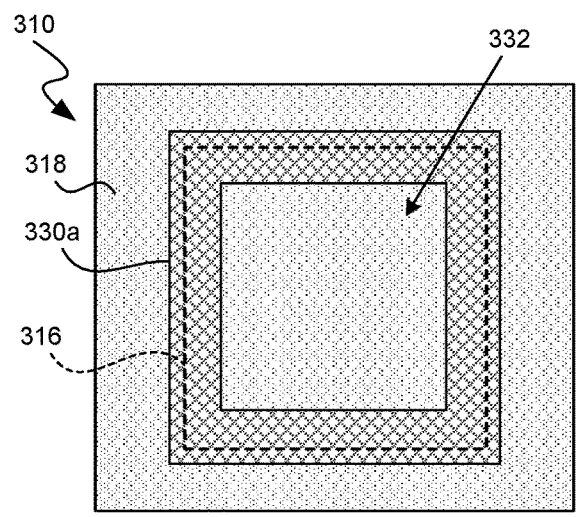
FIG. 3A is a bottom cross-sectional view of a package substrate including reinforcement structures configured in accordance with embodiments of the present technology.

FIG. 3A is a bottom cross-sectional view of a package substrate 310 including a reinforcement structure 330a configured in accordance with embodiments of the present technology. The package substrate 310 can generally be similar to the package substrate 210 described with respect to FIGS. 2A-2F. Accordingly, like numbers are used to identify components of the package substrate 310 that are similar or identical to the corresponding components of FIGS. 2A-2F. For example, the package substrate 310 includes a base structure 318 and a reinforcement structure 330a at least partially embedded in the base structure 318. The reinforcement structure 330a can be configured with any suitable layout, geometry (e.g., size, shape), and positioning along and/or within a die shadow region 316 of the package substrate 310. In the illustrated embodiment, the reinforcement structure 330a spans all of the edges and corners of the die shadow region 316. The reinforcement structure 330a can include a central aperture 332 (e.g., a square-shaped aperture) such that the reinforcement structure 330a is localized to the peripheral portion of the die shadow region 316 (e.g., along the edges and corners) and does not extend substantially into the central portion of the die shadow region 316. In some embodiments, the reinforcement structure 330a is a single continuous structure embedded in the base structure 318. In other embodiments, the reinforcement structure 330a can include a plurality of individual, discrete structures distributed throughout the die shadow region 316 (e.g., positioned along all the edges and/or corners of the die shadow region 316), as discussed in further detail below.

FIGS. 3B-3G illustrate package substrates with various example configurations of reinforcement structures in accordance with embodiments of the present technology. The package substrates shown in FIGS. 3B-3G can be generally similar to the package substrate 310 described with respect to FIG. 3A. Accordingly, like numbers are used to identify similar or identical components, and description of the package substrates shown in FIGS. 3B-3G will be limited to those features that differ from the package substrate 310 of FIG. 3A. Moreover, the various features of the package substrates described with respect to FIGS. 3A-3G can be combined with each other and/or incorporated in any of the semiconductor assemblies discussed with reference to FIGS. 2A-2F.

Figure 3B:
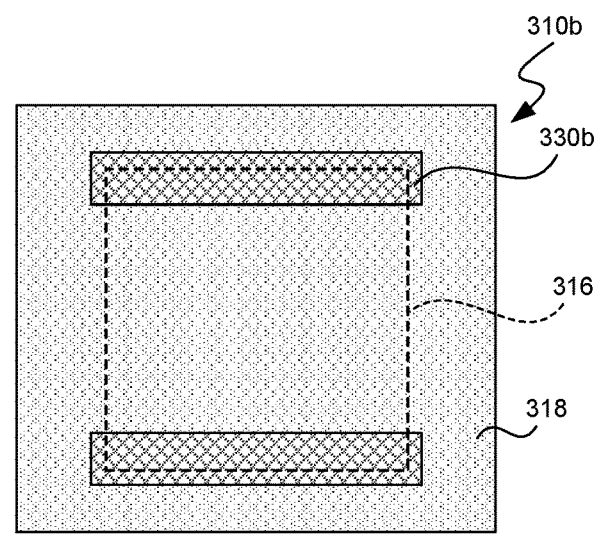
FIG. 3B is a bottom cross-sectional view of another example of a package substrate including reinforcement structures configured in accordance with embodiments of the present technology.

FIG. 3B is a bottom cross-sectional view of a package substrate 310b including reinforcement structures 330b configured in accordance with embodiments of the present technology. The reinforcement structures 330b are generally similar to the reinforcement structure 330a of FIG. 3A, except that the reinforcement structures 330b are positioned along only some of the edges of the die shadow region 316. For example, the embodiment of FIG. 3B illustrates two reinforcement structures 330b positioned along opposing edges of the die shadow region 316. Each reinforcement structure 330b can have an elongated shape (e.g., a rectangular shape) that spans the entire length of the corresponding edge of the die shadow region 316. Alternatively, each reinforcement structure 330b can span only a portion of the length of the corresponding edge (e.g., 75%, 50%, or 25% of the length of the edge). In other embodiments, the package substrate 310b can include the reinforcement structures 330b along adjacent edges (e.g., two or three adjacent edges) of the die shadow region 316. Optionally, the package substrate 310b can include fewer or more reinforcement structures 330b (e.g., a single reinforcement structure 330b positioned along a single edge, three reinforcement structures 330b positioned along three edges of the die shadow region 316).

Figure 3C:
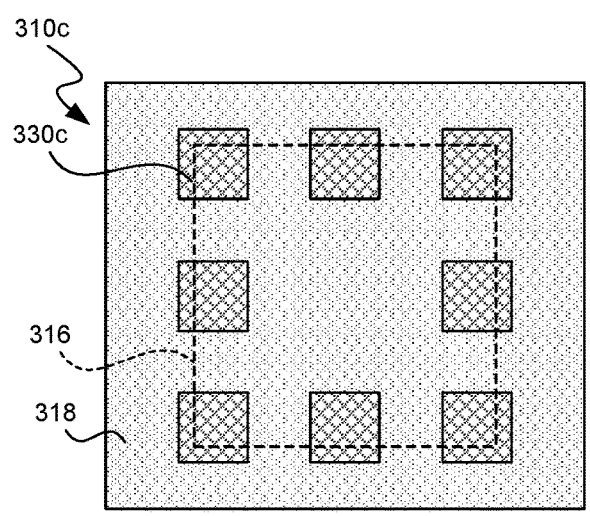
FIG. 3C is a bottom cross-sectional view of another example of a package substrate including reinforcement structures configured in accordance with embodiments of the present technology.

FIG. 3C is a bottom cross-sectional view of a package substrate 310c including reinforcement structures 330c configured in accordance with embodiments of the present technology. The reinforcement structures 330c are generally similar to the reinforcement structure 330a of FIG. 3A, except that the reinforcement structures 330c include multiple structures distributed along the edges and corners of the die shadow region 316. For example, the embodiment of FIG. 3C illustrates four reinforcement structures 330c distributed along each of the four edges of the die shadow region 316 and four reinforcement structures 330c at each of the four corners of the die shadow region 316. In other embodiments, the package substrate 310c includes reinforcement structures 330c distributed along only some of the edges and/or corners of the die shadow region 316 (e.g., only along three edges, two edges, or a single edge; only at three corners, two corners, or a single corners). Optionally, the package substrate 310c can include fewer or more reinforcement structures 330c (e.g., one, two, three, four, five, six, seven, eight, nine, ten, or more) distributed along each edge of the die shadow region 316. In some embodiments, some or all of the reinforcement structures 330c at the corners of the die shadow region 316 can be omitted. Each reinforcement structure 330c can independently have any suitable shape (e.g., a square or rectangular shape), as discussed further below.

Figure 3D:
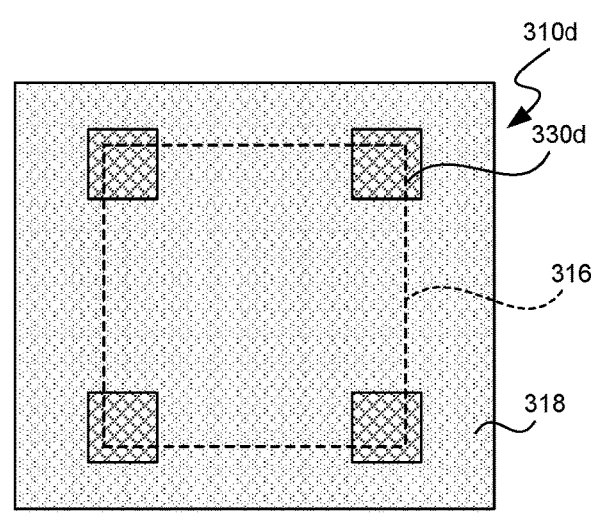
FIG. 3D is a bottom cross-sectional view of another example of a package substrate including reinforcement structures configured in accordance with embodiments of the present technology.

FIG. 3D is a bottom cross-sectional view of a package substrate 310d including reinforcement structures 330d configured in accordance with embodiments of the present technology. The reinforcement structures 330d are generally similar to the reinforcement structure 330a of FIG. 3A, except that the reinforcement structures 330d are located only at the corners of the die shadow region 316. For example, the embodiment of FIG. 3D illustrates one reinforcement structure 330d located at each of the four corners of the die shadow region 316. Alternatively, the reinforcement structures 330d can be located at three corners, two corners, or a single corner of the die shadow region 316. In other embodiments, the package substrate 310d can include fewer or more reinforcement structures 330d (e.g., one, two, three, five, six or more) at each corner of the die shadow region 316. Each reinforcement structure 330d can independently have any suitable shape (e.g., a square or rectangular shape), as discussed further below.

Figure 3E:
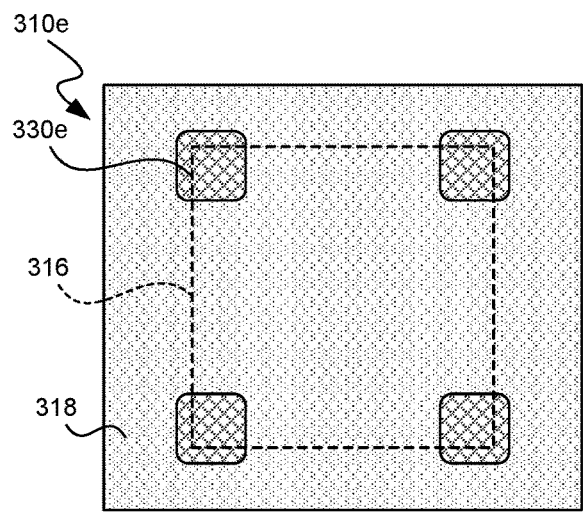
FIG. 3E is a bottom cross-sectional view of another example of a package substrate including reinforcement structures configured in accordance with embodiments of the present technology.

FIG. 3E is a bottom cross-sectional view of a package substrate 310e including reinforcement structures 330e configured in accordance with embodiments of the present technology. The reinforcement structures 330e are generally similar to the reinforcement structures 330d of FIG. 3D, except that the reinforcement structures 330e have a different cross-sectional shape. For example, the embodiment of FIG. 3E illustrates the reinforcement structures 330e as each having a rectangular shape with rounded corners. This configuration can be advantageous for reducing stress concentration at the corners of the reinforcement structures 330e.

Figure 3F:
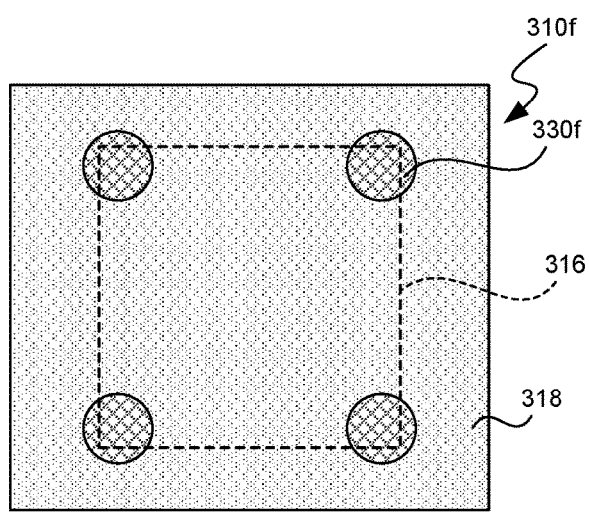
FIG. 3F is a bottom cross-sectional view of another example of package substrate including reinforcement structures configured in accordance with embodiments of the present technology.

FIG. 3F is a bottom cross-sectional view of a package substrate 310f including reinforcement structures 330f configured in accordance with embodiments of the present technology. The reinforcement structures 330f are generally similar to the reinforcement structures 330d of FIG. 3D, except that the reinforcement structures 330f have a different cross-sectional shape. For example, the embodiment of FIG. 3F illustrates the reinforcement structures 330f as each having a circular shape.

Figure 3G:
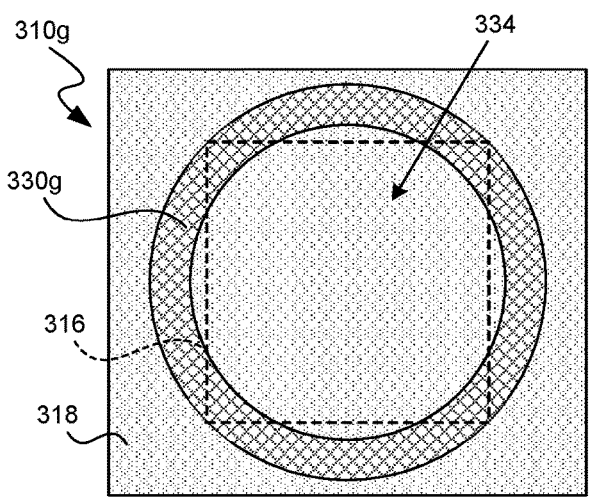
FIG. 3G is a bottom cross-sectional view of another example of package substrate including reinforcement structures configured in accordance with embodiments of the present technology.

FIG. 3G is a bottom cross-sectional view of a package substrate 310g including a circular or elliptical reinforcement structure 330g configured in accordance with embodiments of the present technology. The reinforcement structure 330g can overlap some or all of the corners of the die shadow region 316. Optionally, the reinforcement structure 330g can include a central aperture 334 (e.g., a circular or elliptical aperture) such that the reinforcement structure 330g is localized to the peripheral portion of the die shadow region 316 and does not extend substantially into the central portion of the die shadow region 316. The reinforcement structure 330g may be advantageous because the circular or elliptical shape is expected to avoid stress concentrations in corners.

It will be appreciated that the reinforcement structures 330a-g described with respect to FIGS. 3A-3G can have any suitable cross-sectional shape (e.g., oblong, oval, elliptical, polygonal, or curvilinear, or a combination thereof). In embodiments where a package substrate includes multiple reinforcement structures, some or all of the reinforcement structures can have the same shape or different shapes. Moreover, some or all of the reinforcement structures can have the same dimensions (e.g., cross-sectional are, height, width, etc.) or different dimensions. The number and configuration of reinforcement structures 330a-g can also be varied as desired.

Figure 4A:
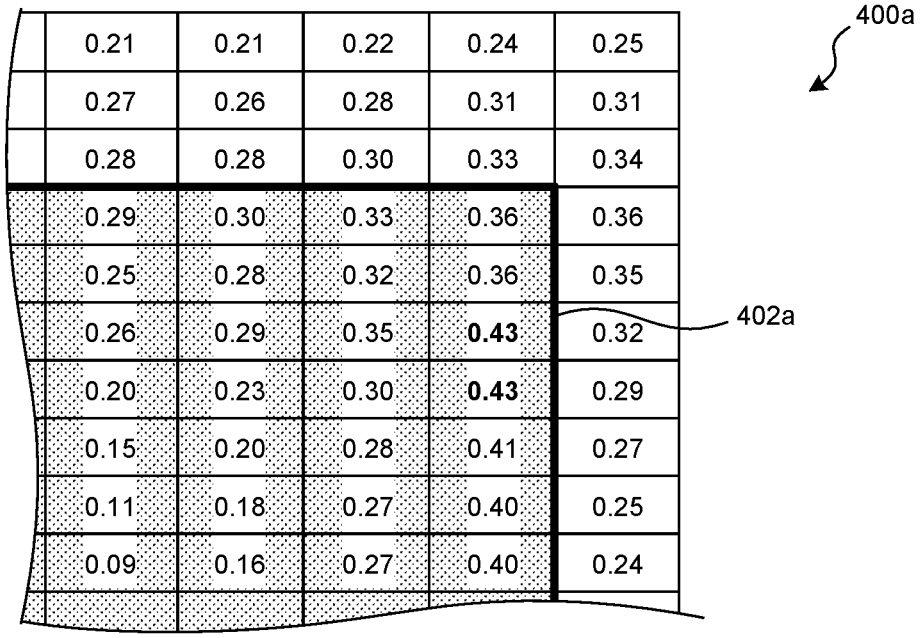
FIG. 4A is a simulated strain energy density map of an array of connectors within the semiconductor assembly of FIG. 1B.
Figure 4B:
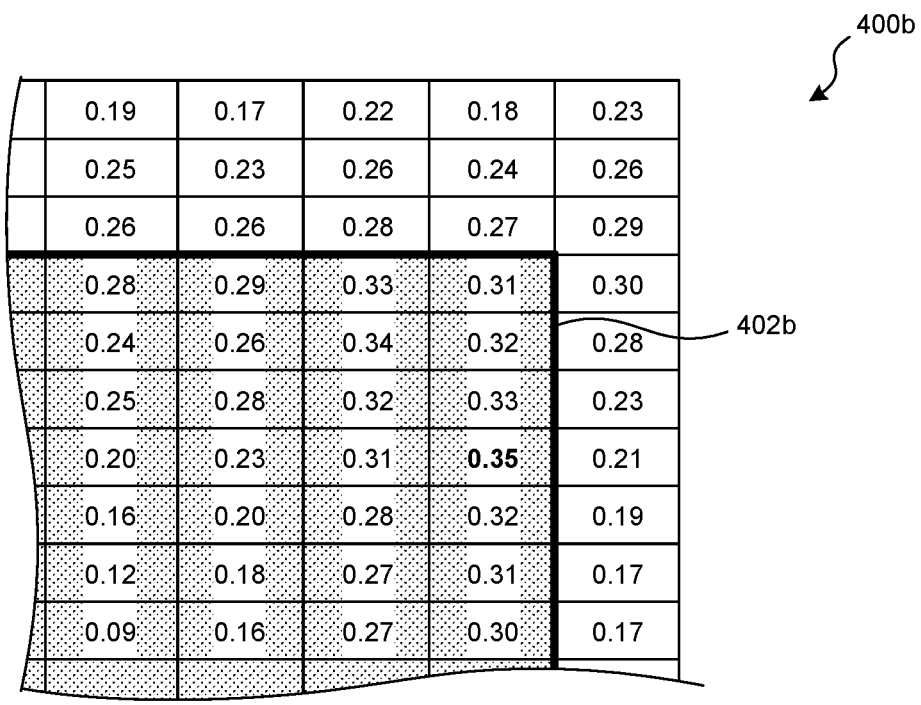
FIG. 4B is a simulated strain energy density map of an array of connectors within the semiconductor assembly of FIG. 2A.

FIGS. 4A and 4B illustrate simulated strain energy density maps for connectors in semiconductor assemblies under thermomechanical loading. More specifically, FIG. 4A is a strain energy density map 400a of the array of connectors 120 of the assembly 100 of FIGS. 1A and 1B (which do not include reinforcement structures), and FIG. 4B is a strain energy density map 400b of the array of connectors 220 of the assembly 200 of FIG. 2A (which includes reinforcement structures). In FIGS. 4A and 4B, each cell represents a single connector of the respective array. Shaded cells correspond to connectors underneath the respective die shadow regions 402a-b, while unshaded cells correspond to connectors outside the die shadow regions 402a-b. The numerical value in each cell indicates the amount of strain energy density on the corresponding connector. Strain energy density can correspond to the fatigue life for a connector. For example, a higher strain energy density value can correspond to a lower mean life for the connector.

Referring to FIGS. 4A and 4B together, the maximum strain energy density value for the connectors in FIG. 4A is 0.43 (indicated by bolded values in FIG. 4A), while the maximum strain energy density value for the connectors in FIG. 4B is 0.35 (indicated by bolded value in FIG. 4B), a reduction of approximately 20%. The simulation results shown in FIGS. 4A and 4B demonstrate that the reinforcement structures described herein can reduce the amount of strain on connectors underneath the die shadow region, which may improve the fatigue life of the connector and/or reduce the likelihood of failure.

Figure 5:
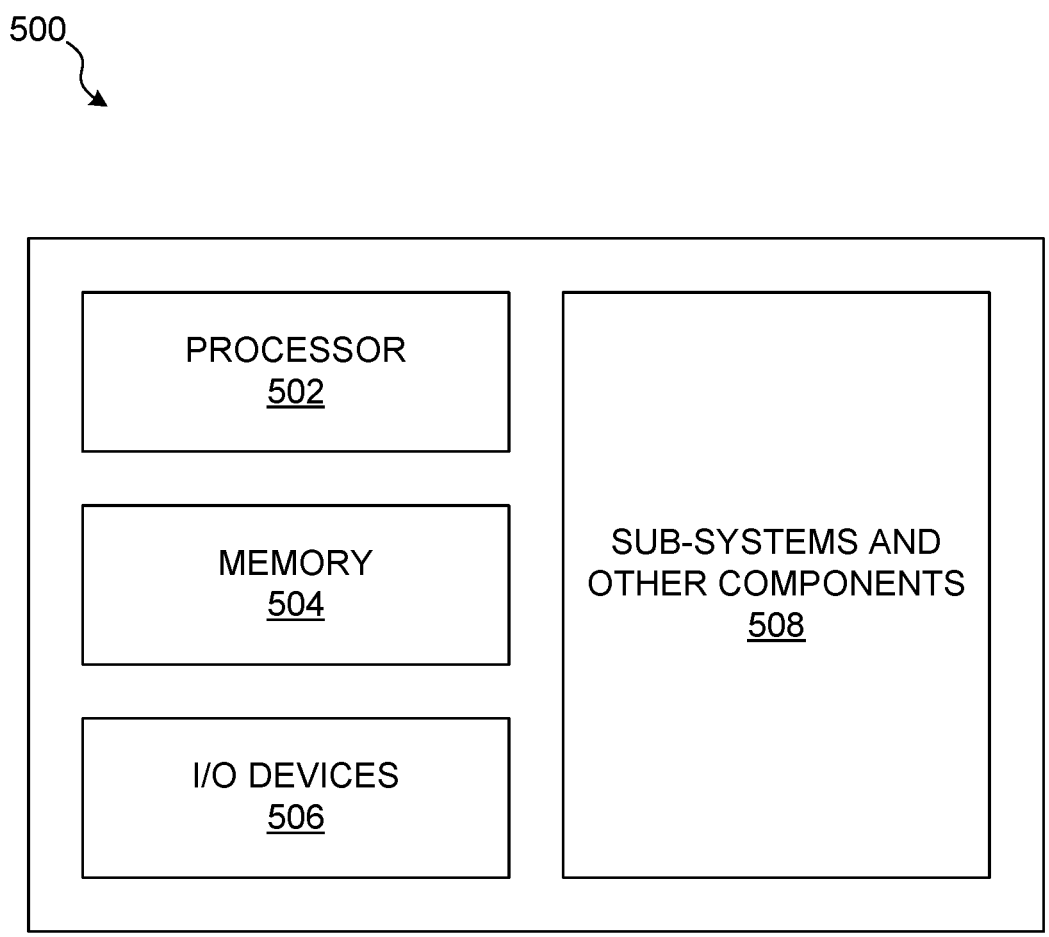
FIG. 5 is a schematic view of a system that includes a semiconductor device or package configured in accordance with embodiments of the present technology.

Any one of the semiconductor devices and/or packages having the features described above with reference to FIGS. 2A-4B can be incorporated into any of a myriad of larger and/or more complex systems, a representative example of which is system 500 shown schematically in FIG. 5. The system 500 can include a processor 502, a memory 504 (e.g., SRAM, DRAM, flash, and/or other memory devices), input/output devices 506, and/or other subsystems or components 508. The semiconductor dies and/or packages described above with reference to FIGS. 2A-4B can be included in any of the elements shown in FIG. 5. The resulting system 500 can be configured to perform any of a wide variety of suitable computing, processing, storage, sensing, imaging, and/or other functions. Accordingly, representative examples of the system 500 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 500 include lights, cameras, vehicles, etc. With regard to these and other example, the system 500 can be housed in a single unit or distributed over multiple interconnected units, e.g., through a communication network. The components of the system 500 can accordingly include local and/or remote memory storage devices and any of a wide variety of suitable computer-readable media.

From the foregoing, it will be appreciated that specific embodiments of the technology have been described herein for purposes of illustration, but that various modifications may be made without deviating from the disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described herein.

What is claimed:

1. A method for manufacturing a semiconductor assembly, the method comprising:
    fabricating a substrate by:
        forming a recess in a base structure, and
        positioning a reinforcement structure at least partially in the recess, wherein the reinforcement structure has a higher stiffness than the base structure; and
    mounting a semiconductor die onto the substrate such that the semiconductor die is positioned at least partially over the reinforcement structure.

2. The method of claim 1 wherein the recess is formed by removing a portion of the base structure.

3. The method of claim 2 wherein the portion of the base structure is removed by cutting or drilling.

4. The method of claim 1 wherein the reinforcement structure is deposited, bonded, or laminated into the recess.

5. The method of claim 1 wherein the reinforcement structure is a pre-formed component that is inserted into the recess.

6. The method of claim 1 wherein the reinforcement structure is formed in situ within the recess.

7. The method of claim 1, further comprising coupling an array of conductive elements to the substrate.

8. The method of claim 7, further comprising aligning the substrate to the array such that the reinforcement structure is positioned over one or more conductive elements of the array.

9. The method of claim 7, further comprising mounting the substrate to a printed circuit board via the array.

10. The method of claim 1 wherein the reinforcement structure has a higher coefficient of thermal expansion than the base structure.

11. The method of claim 1 wherein an edge of the semiconductor die is positioned over or near the reinforcement structure.

12. The method of claim 1 wherein fabricating the substrate further comprises:
    forming a plurality of recesses in the base structure; and
    positioning a reinforcement structure in each of the recesses.

13. The method of claim 12, wherein the semiconductor die includes a plurality of corners, and wherein the plurality of recesses include recesses positioned beneath each corner of the semiconductor die.

14. A method of manufacturing a semiconductor assembly comprising:
    forming a recess in a first substrate section;
    positioning a reinforcement structure in the recess, wherein the reinforcement structure has a higher stiffness than the first substrate section;
    forming a package substrate by coupling a second substrate section to the first substrate section such that the reinforcement structure is disposed between the first and second substrate sections; and
    mounting a semiconductor die on the package substrate.

15. The method of claim 14, wherein the first substrate section and the second substrate section, are coupled by laminating or bonding.

16. The method of claim 14, wherein the semiconductor die is mounted onto the package substrate above a die shadow region of the package substrate, and wherein the reinforcement structure is positioned at least partially within the die shadow region.

17. The method of claim 16, wherein a length of the reinforcement structure spans an entire length of an edge of the die shadow region.

18. The method of claim 14, wherein the reinforcement structure has circular or elliptical shape.

19. The method of claim 14, wherein the reinforcement structure is pre-formed prior to positioning the reinforcement structure in the recess.

20. A method of manufacturing a semiconductor assembly comprising:
    forming a lower substrate section including a base material;
    forming a middle substrate section including a plurality of reinforcement structures and a portion of the base material adjacent to the plurality of reinforcement structures;
    forming an upper substrate section including the base material;
    assembling a package substrate by coupling the lower substrate section, the middle substrate section, and the upper substrate section; and
    mounting a semiconductor die on the package substrate.

* * * * *